United States Patent
Amin-Shahidi et al.

(10) Patent No.: US 9,743,547 B1
(45) Date of Patent: Aug. 22, 2017

(54) SWITCHABLE MECHANICAL CONSTRAINT FOR ELECTRICAL CONNECTOR WITH COMPLIANT MOUNTING

(71) Applicant: HGST Netherlands B.V., Amsterdam (NL)

(72) Inventors: Darya Amin-Shahidi, San Jose, CA (US); Thomas Albrecht, San Jose, CA (US); Toshiki Hirano, San Jose, CA (US)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 15/132,651

(22) Filed: Apr. 19, 2016

(51) Int. Cl.
*H05K 7/14* (2006.01)
*G06F 1/18* (2006.01)

(52) U.S. Cl.
CPC ........... *H05K 7/1417* (2013.01); *G06F 1/181* (2013.01)

(58) Field of Classification Search
CPC ........ H05K 7/1417; G06F 1/181; H01R 13/74
See application file for complete search history.

(56) References Cited

U.S. PATENT DOCUMENTS

| | | | | |
|---|---|---|---|---|
| 4,501,460 A * | 2/1985 | Sisler | ...................... | G06F 1/181 361/679.58 |
| 5,269,698 A * | 12/1993 | Singer | ................... | G11B 25/043 361/679.33 |
| 5,277,615 A * | 1/1994 | Hastings | ................. | G06F 1/181 361/679.32 |
| 5,325,263 A * | 6/1994 | Singer | ..................... | G06F 1/184 361/679.39 |
| 5,557,499 A | 9/1996 | Reiter et al. | | |
| 5,619,398 A * | 4/1997 | Harrison | ............... | G06F 1/1632 361/679.43 |
| 5,652,695 A | 7/1997 | Schmitt | | |
| 5,764,481 A * | 6/1998 | Ruch | ..................... | G06F 1/1632 361/679.31 |

(Continued)

FOREIGN PATENT DOCUMENTS

EP 2309611 4/2011

OTHER PUBLICATIONS

International Search Report and Written Opinion for International Patent Application No. PCT/US2017/020296 dated May 30, 2017.

(Continued)

*Primary Examiner* — Lisa Lea Edmonds
(74) *Attorney, Agent, or Firm* — Kunzler Law Group, PC (57) ABSTRACT

Described herein is a system that includes a sled and a data storage device positioned within the sled. The sled includes a base, an electrical connector positioned within and movable relative to the base, and a locking mechanism. The locking mechanism is positioned within the base and movable, relative to the base and the electrical connector, between a locked position and a unlocked position. In the locked position, the locking mechanism restricts movement of the electrical connector in at least one degree of freedom relative to the base. In the unlocked position, the locking mechanism does not restrict movement of the electrical connector in the at least one degree of freedom relative to the base. The data storage device is co-movably coupled to the electrical connector.

20 Claims, 9 Drawing Sheets

(56) References Cited

U.S. PATENT DOCUMENTS

| | | | | |
|---|---|---|---|---|
| 5,818,691 A * | 10/1998 | McMahan | | E05C 19/022 |
| | | | | 361/679.43 |
| 5,928,016 A * | 7/1999 | Anderson | | H05K 7/1411 |
| | | | | 361/801 |
| 6,008,984 A * | 12/1999 | Cunningham | | G11B 33/128 |
| | | | | 312/332.1 |
| 6,084,768 A | 7/2000 | Bologna | | |
| 6,111,754 A * | 8/2000 | Abbott | | G06F 1/184 |
| | | | | 312/223.2 |
| 6,115,245 A * | 9/2000 | Ruch | | G06F 1/1632 |
| | | | | 361/679.41 |
| 6,227,632 B1 * | 5/2001 | Liu | | G06F 1/181 |
| | | | | 312/223.2 |
| 6,288,902 B1 * | 9/2001 | Kim | | G11B 33/08 |
| | | | | 206/701 |
| 6,424,523 B1 * | 7/2002 | Curtis | | G11B 33/128 |
| | | | | 312/331 |
| 6,621,693 B1 | 9/2003 | Potter et al. | | |
| 7,102,886 B2 * | 9/2006 | Peng | | G06F 1/181 |
| | | | | 211/26 |
| 7,108,524 B2 * | 9/2006 | Wahler | | G06K 13/08 |
| | | | | 439/159 |
| 7,163,422 B2 | 1/2007 | Amano et al. | | |
| 8,009,425 B2 * | 8/2011 | Kang | | G06F 1/181 |
| | | | | 248/27.3 |
| 8,305,751 B2 * | 11/2012 | Merrow | | G11B 19/042 |
| | | | | 312/223.1 |
| 8,369,087 B2 * | 2/2013 | Wu | | G06F 1/181 |
| | | | | 361/679.58 |
| 8,677,381 B2 * | 3/2014 | Kawakami | | G11B 33/124 |
| | | | | 360/92.1 |
| 8,737,078 B2 * | 5/2014 | Zhang | | H05K 5/0221 |
| | | | | 312/223.1 |
| 8,953,281 B1 | 2/2015 | Lee et al. | | |
| 9,268,357 B2 * | 2/2016 | Kyle | | G06F 1/16 |
| 9,612,629 B2 * | 4/2017 | Hirano | | G06F 1/181 |
| 2003/0161118 A1 | 8/2003 | Bovell | | |
| 2008/0239650 A1 | 10/2008 | Fujie et al. | | |
| 2010/0002366 A1 | 1/2010 | Pav | | |
| 2013/0148287 A1 | 6/2013 | Chang | | |
| 2014/0340837 A1 * | 11/2014 | Jau | | G06F 1/16 |
| | | | | 361/679.33 |
| 2015/0146353 A1 | 5/2015 | MacNeil et al. | | |
| 2015/0359115 A1 * | 12/2015 | Hirano | | G06F 1/181 |
| | | | | 361/679.34 |
| 2016/0050795 A1 * | 2/2016 | Conn | | H05K 7/1485 |
| | | | | 454/184 |
| 2016/0066468 A1 * | 3/2016 | Smith | | H05K 7/208 |
| | | | | 361/679.52 |

OTHER PUBLICATIONS

International Search Report and Written Opinion for International Patent Application No. PCT/US2017/020295 dated Jun. 2, 2017.

* cited by examiner

SWITCHABLE MECHANICAL CONSTRAINT FOR ELECTRICAL CONNECTOR WITH COMPLIANT MOUNTING

FIELD

This disclosure relates generally to constraints for electrical connectors and more particularly to mechanical constraints for electrical connectors in electronic device array sleds.

BACKGROUND

Electronic devices, such as electronic information storage apparatuses, including hard disk drives, are commonly used for storing and retrieving digital information. Electronic devices are often mounted in a vertically or horizontally stacked array within a structure or cage. For example, a hard disk drive array sled may house a plurality of individually-connected hard disk drives. Such a hard disk drive array sled allows removal and replacement of an individual hard disk drive within the sled without disrupting the other hard disk drives within the sled.

In a hard disk drive array sled, each hard disk drive may be connected to an electrical connector (such as a Serial Attached SCSI (Small Computer System Interface) connector (SAS connector)) within the sled. The electrical connector can then be operatively coupled to a printed circuit board within the sled. A hard disk drive array sled promotes the protection of the electrical connector and printed circuit board, as well as the hard disk drives, during the removal and replacement of the hard disk drives. In this manner, the performance and reliability of the hard disk drives can be maintained.

In some environments, such as those exposing a sled to vibrations and other movements, allowing the hard disk drives and associated electrical connectors to move and flex within the sled isolates vibration disturbances from the drives, which allows the drives to operate more precisely, resulting in higher data density and/or data reliability. In addition, allowing the hard disk drives and associated electrical connectors to move and flex within the sled may reduce damage to the hard disk drives and electrical connectors. However, such movement and flexibility may be detrimental during installation of the hard disk drives into a sled and removal of the hard disk drives from the sled.

SUMMARY

The subject matter of the present application has been developed in response to the present state of the art, and in particular, in response to the shortcomings of electronic device array sleds, that have not yet been fully solved by currently available techniques. Accordingly, the subject matter of the present application has been developed to provide a locking mechanism to constrain an electrical connector in at least one degree of freedom and overcome at least some of the above-discussed shortcomings of prior art techniques.

According to one embodiment, a system includes a sled and a data storage device positioned within the sled. The sled includes a base, an electrical connector positioned within and movable relative to the base, and a locking mechanism. The locking mechanism is positioned within the base and movable, relative to the base and the electrical connector, between a locked position and an unlocked position. In the locked position, the locking mechanism restricts movement of the electrical connector in at least one degree of freedom relative to the base. In the unlocked position, the locking mechanism does not restrict movement of the electrical connector in the at least one degree of freedom relative to the base. The data storage device is co-movably connected to the electrical connector.

In certain implementations of the system, the sled further includes a cover configured to open and close, and the locking mechanism moves relative to the base between the locked position when the cover is open and the unlocked position when the cover is closed.

According to some implementations of the system, the electrical connector includes one of a printed circuit board, a flex printed circuit board, or a cable.

According to some implementations of the system, the sled includes a biasing element configured to bias the locking mechanism to the locked position. In some implementations, the biasing element is configured to bias the locking mechanism to the locked position when the cover is open. According to some implementations, the cover disengages the locking mechanism when the cover is closed.

According to some implementations of the system, the sled includes a mechanical coupling between the cover and the locking mechanism. In some implementations, the mechanical coupling is configured to move the locking mechanism to the unlocked position when the cover is closed.

According to some implementations of the system, the biasing element includes a spring coupled to the locking mechanism at a first end of the spring and coupled to the sled at a second end of the spring. In some implementations, the spring attaches to a spring attachment point of the locking mechanism at a first end of the spring and attaches to the base at a second end of the spring.

In some implementations of the system, the locking mechanism includes a locking feature. In some implementations, the locking feature restricts movement of a tab of the electrical connector in at least one degree of freedom when the locking mechanism is in the locked position. In some implementations, the locking feature does not restrict movement of a tab of the electrical connector in the at least one degree of freedom when the locking mechanism is in the unlocked position.

According to some implementations of the system, the locking mechanism includes a push tab. In some implementations, the sled includes a mechanical coupling between the cover and the push tab. In some implementations, the mechanical coupling is configured to move the locking mechanism to the unlocked position when the cover is closed.

According to some implementations of the system, the locking feature includes a hook. According to one implementation of the system, the hook engages a tab on the electrical connector. In some implementations, the electrical connector is a printed circuit board. In some implementations, the electrical connector is an SAS connector.

In some implementations, the system further includes an enclosure to store the sled. The enclosure includes an engagement element. As the sled is positioned in the enclosure, the engagement element of the enclosure extends through the base and engages the locking mechanism to move the locking mechanism into the unlocked position.

In some implementations of the system, the sled includes an anchor configured to moveably retain the locking mechanism to the base. In some implementations, the locking mechanism includes an elongated slot. In some implementations, the anchor and elongated slot are configured to restrict movement of the locking mechanism to a single direction.

According to certain implementations of the system, the electrical connector is a printed circuit board, and the printed circuit board is resiliently flexible to allow movement of the printed circuit board relative to the base.

In some implementations of the system, the electrical connector is a printed circuit board. In some implementations, the printed circuit board includes a plurality of data storage device socket locations. In some implementations, a data storage device socket location includes at least one tab.

According to yet another embodiment, a sled is disclosed. The sled includes a base, an electrical connector positioned within and movable relative to the base, and a locking mechanism. The locking mechanism is positioned within the base and movable, relative to the base and the electrical connector, between a locked position and an unlocked position. In the locked position, the locking mechanism restricts movement of the electrical connector in at least one degree of freedom relative to the base. In the unlocked position, the locking mechanism does not restrict movement of the electrical connector in the at least one degree of freedom relative to the base.

According to some implementations of the sled, the sled includes a cover configured to open and close, and the locking mechanism moves relative to the base between the locked position when the cover is open and the unlocked position when the cover is closed.

In certain implementations of the sled, the electrical connector includes a printed circuit board, and the printed circuit board is resiliently flexible to allow movement of the printed circuit board relative to the base.

In some implementations of the sled, the sled includes a biasing element configured to bias the locking mechanism to the locked position. In some implementations, the sled includes a mechanical coupling between the cover and the locking mechanism, the mechanical coupling configured to move the locking mechanism to the unlocked position when the cover is closed.

According to certain implementations, the biasing element includes a spring coupled to the locking mechanism at a first end of the spring and the sled at a second end of the spring.

In some implementations of the sled, the electrical connector includes an SAS connector.

In some implementations of the sled, the locking mechanism includes a push tab. In some implementations, the sled includes a mechanical coupling between the cover and the push tab. In some implementations, the mechanical coupling is configured to move the locking mechanism to the unlocked position when the cover is closed.

According to some implementations of the sled, the locking feature includes a hook. In some implementations, the hook restricts movement of a tab of the electrical connector in at least one degree of freedom when the locking mechanism is in the locked position. In some implementations, the hook does not restrict movement of a tab of the electrical connector in the at least one degree of freedom when the locking mechanism is in the unlocked position.

According to another embodiment, a method of constraining an electrical connector in at least one degree of freedom includes providing a sled including a base, an electrical connector, and a locking mechanism. The locking mechanism moves relative to the base between a locked position and an unlocked position. According to some implementations, the method further includes opening a cover relative to the base. According to some implementations, the method further includes moving the locking mechanism to the locked position to restrict movement of the electrical connector in at least one degree of freedom relative to the base. According to some implementations, the method further includes moving the locking mechanism to the unlocked position to not restrict movement of the electrical connector in the at least one degree of freedom relative to the base.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1A:
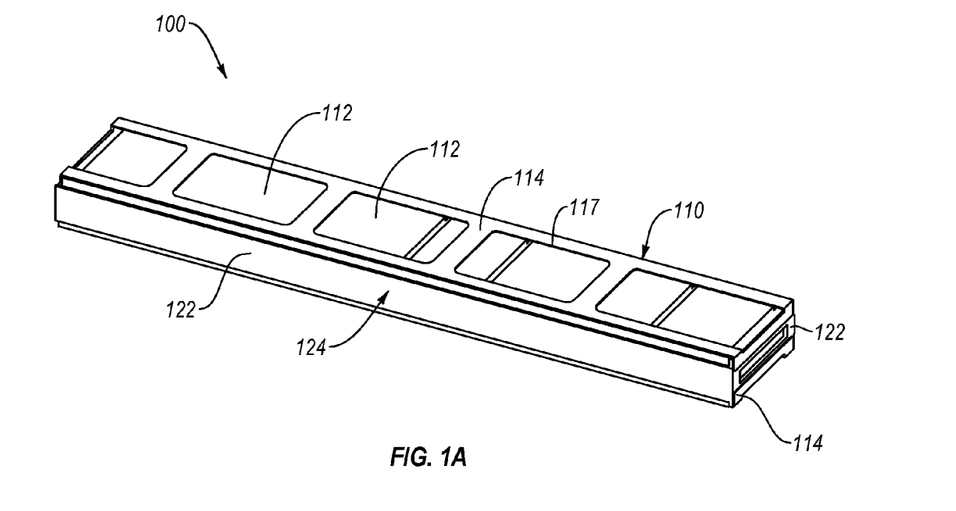
FIG. 1A is a perspective view of an array of electronic devices within an electronic device array sled, according to one or more embodiments of the present disclosure.
Figure 1B:
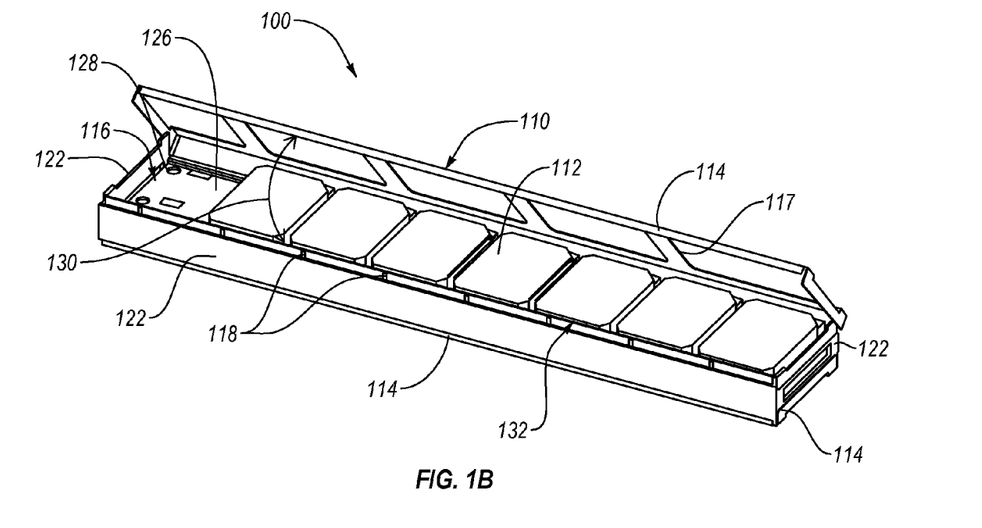
FIG. 1B is a perspective view of the electronic device array sled with a cover in an open position, according to one or more embodiments of the present disclosure.
Figure 1C:
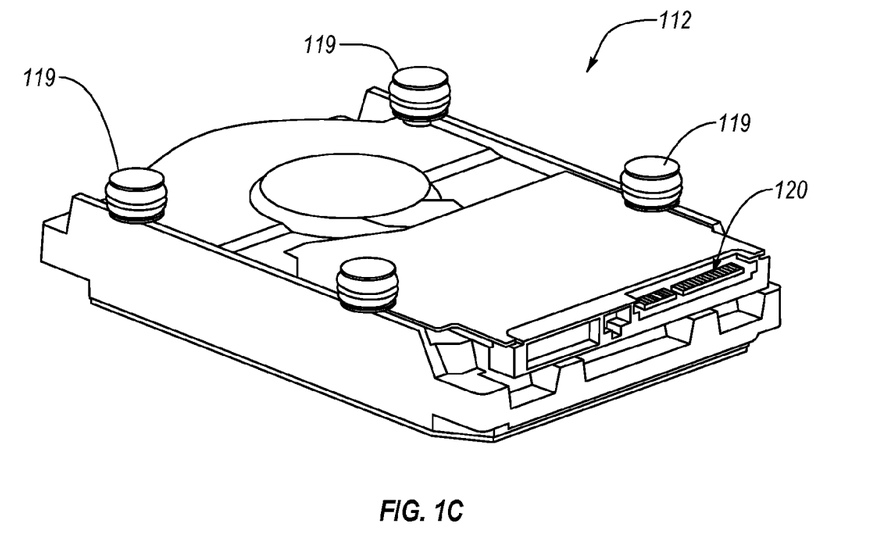
FIG. 1C is a perspective view of an electronic device, including compliant mounting feet, according to one or more embodiments of the present disclosure.
Figure 2:
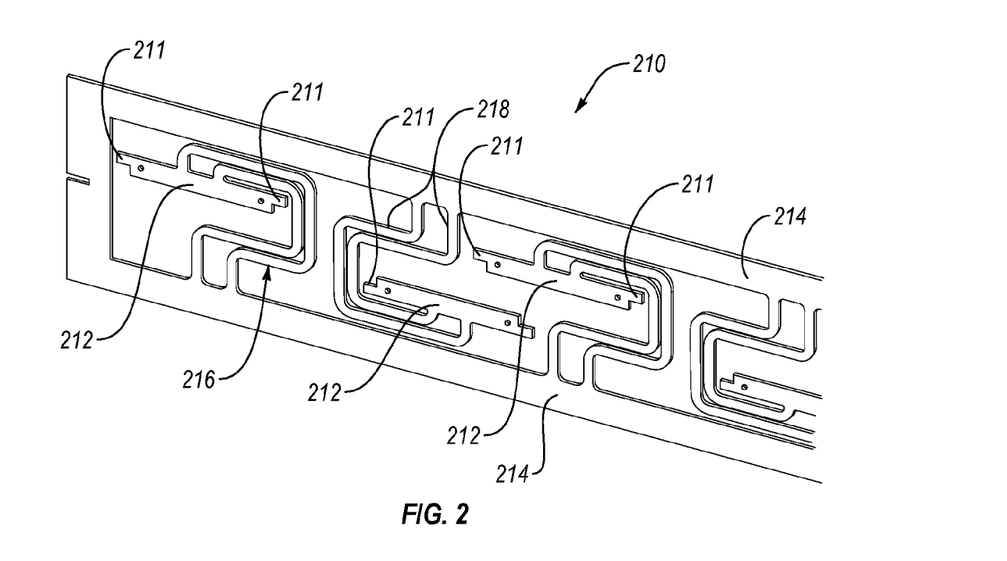
FIG. 2 is a perspective view of a portion of a printed circuit board of an electronic device array sled, according to one or more embodiments of the present disclosure.

Referring to FIGS. 1A and 1B, a system 100 includes a sled 110 and an array of electronic devices 112 positioned within the sled 110. Generally, the sled 110 is configured to facilitate the storage and protection of the electronic devices 112, while allowing electronic interconnectivity with the electronic devices 112 from outside the sled 110. Because the sled 110 houses an array of electronic devices 112, the sled 110 can be considered an electronic device array sled. The electronic devices 112 can be any of various electronic devices. For example, according to some implementations, the electronic devices 112 are data storage devices, such as hard disk drives, tape drives, solid-state memory drives, and the like. In implementations where the array of electronic devices 112 is an array of hard disk drives, the sled 110 can be considered a hard disk drive array sled. The electronic device 112 includes an electronic connection 120 (as shown in FIG. 1C) from which the electronic device 112 may be connected to and coupled to the sled 110.

The sled 110 includes a base 124 and at least one cover 114 coupleable to the base 124. Generally, the electronic devices 112 are mounted to the base 124 and at least partially housed within the base 124. The base 124 includes sidewalls 122 and a mounting plate 126 fixed relative to the sidewalls 122. The mounting plate 126 can be fixed directly to the sidewalls 122 via any of various fixation techniques, such as fasteners, brackets, mounts, bonding, adhesion, and the like. Moreover, the mounting plate 126 is configured to receive and at least partially support the electronic devices 112 thereon. In some implementations, the mounting plate 126 includes mounting features 128 configured to engage corresponding mounting features such as mounting feet 119 (as shown in FIG. 1C) of the electronic devices 112. Additionally, the base 124 includes at least one interior cavity 116 defined between the sidewalls 122 and the mounting plate 126. The at least one interior cavity 116 is accessible through at least one opening 130 created by opening the cover 114, the opening 130 defined by the open ends of the sidewalls 122.

In the illustrated embodiments, the base 124 includes two interior cavities 116 accessible by separate openings 130, respectively, of the base 124. The interior cavities 116 are defined and separated by the mounting plate 126 with an interior cavity 116 above the mounting plate 126 and an interior cavity 116 below the mounting plate 126. In this manner, electronic devices 112 can be mounted to both sides of the mounting plate 126 with electronic devices 112 mounted to the top side of the mounting plate 126 positioned within one interior cavity 116 and electronic devices 112 mounted to the bottom side of the mounting plate 126 positioned within an opposing interior cavity 116. Although the sled 110 in illustrated embodiments is a two-sided sled 110, other embodiments of the sled 110 can be one-sided. In such embodiments, the sled 110 can include only one interior cavity 116 accessible through a single cover 114.

The cover 114 is configured to at least partially cover the opening of one interior cavity 116 of the base 124, to at least partially restrict access to the interior cavity 116, in a closed position (see, e.g., FIG. 1A) and allow access to the interior cavity 116 of the base 124, via the opening of the cavity 116, in an open position (see, e.g., FIG. 1B). According to one embodiment, the cover 114 is movably coupled to the base 124 and movable between the closed and open position. For example, the cover 114 can be pivotally coupled to the base 124, such as via a hinge joint, to pivot between the closed and open position. According to another embodiment, the cover 114 may be configured like a lid and be removably coupled to the sled 110 to position the cover in the closed position and removed from the sled to position the cover in the open position. Two covers 114, each covering a respective one of the interior cavities, are depicted in FIGS. 1A and 1B. In some implementations, the covers 114 include openings 117 for facilitating viewability of the interior cavity 116 and/or to allow airflow into the interior cavity 116 when the cover is in the closed position.

In the illustrated implementation, the sled 110 stores eight individual electronic devices 112 on each side of the sled 110. Referring to FIG. 1B, one of the electronic devices 112 has been removed through the opening 130. The individual electronic devices 112 on each side of the sled 110 collectively define an array of electronic devices 112. In FIG. 1A, with the cover 114 in the closed position, the cover 114 overlays the first array of electronic devices 112 to at least partially retain and protect the electronic devices within the sled 110. In contrast, as shown in FIG. 1B, the electronic devices 112 are accessible for removal or inspection when the cover 114 is moved (e.g., rotated) into the open position.

Although only shown in the closed position, the sled 110 includes another lower cover 114 on an opposing side of the sled 110. Similar to the upper cover 114, when the lower cover 114 is in the closed position, the lower cover 114 overlays a second array of electronic devices 112 to at least partially retain and protect the electronic devices within the sled 110. In contrast, although not shown, when the lower cover 114 is moved into the open position, the electronic devices 112 in the second array are accessible for removal or inspection similar to what is shown in FIG. 1B for the first array.

Figure 3:
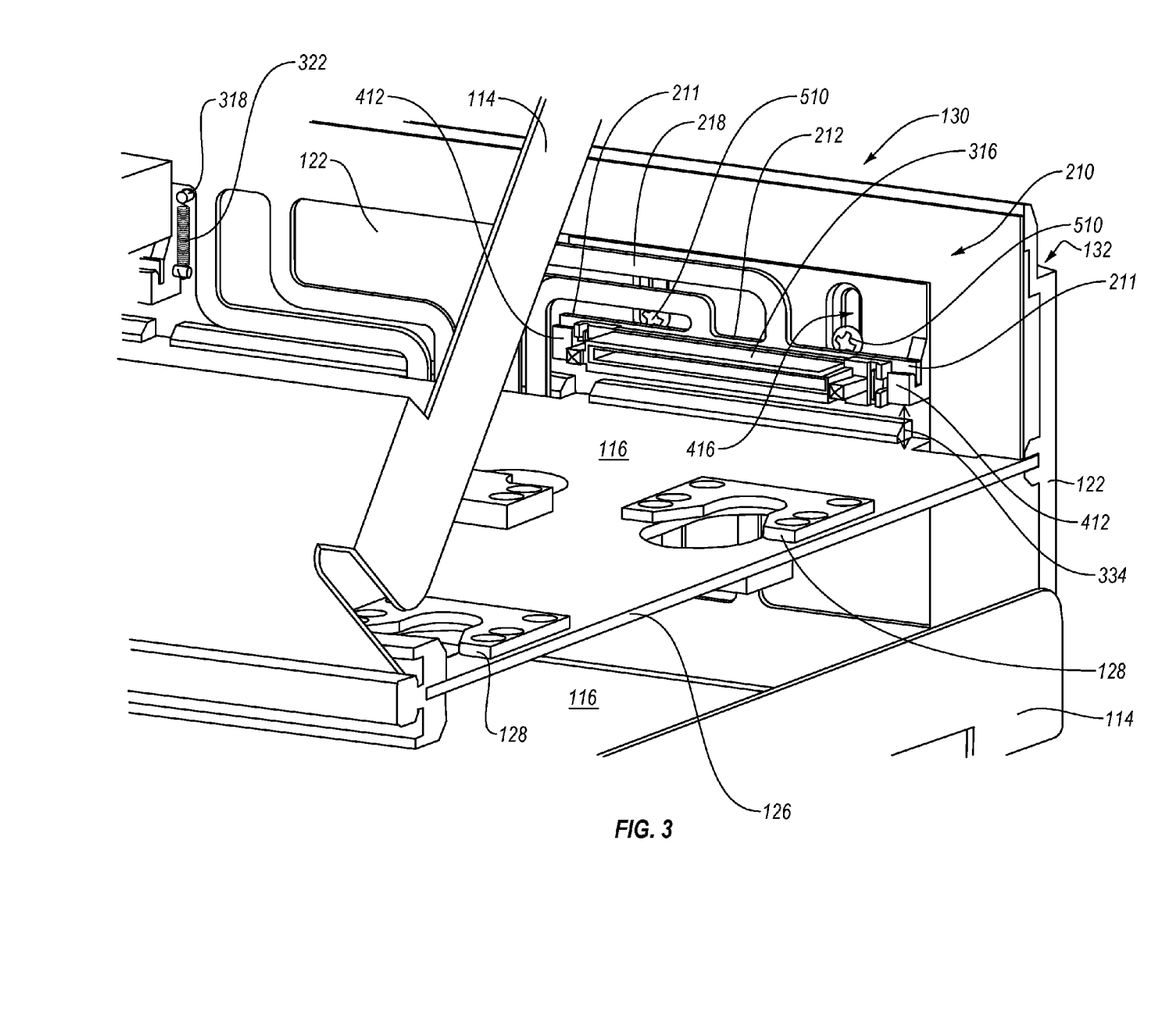
FIG. 3 is a cross-sectional perspective view of an electronic device array sled with a cover open, according to one or more embodiments of the present disclosure.
Figure 4:
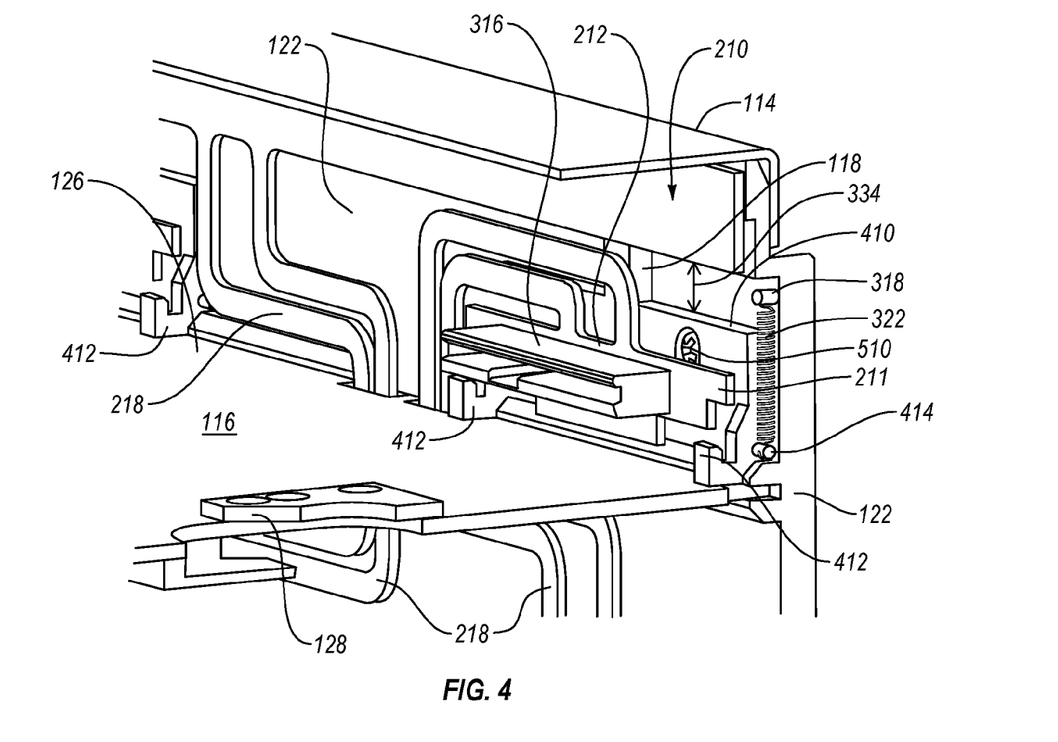
FIG. 4 is a cross-sectional perspective view of the electronic device array sled with the cover closed, according to one or more embodiments of the present disclosure.

Referring to FIGS. 2-5, according to some implementations, the sled 110 includes a printed circuit board 210 configured to facilitate electrical connectivity of the electronic devices 112 stored inside the sled 110 to electronic components (e.g., computers, servers, etc.) located outside the sled. The printed circuit board 210 includes a frame 214 and a compliant portion 216 resiliently flexibly coupled to the frame 214. As shown in FIGS. 3-4, the printed circuit board 210 is positioned within the interior cavity 116, with the frame 214 being fixed between the sidewall 122 and the mounting plate 126 of the sled 110. In some embodiments, the frame 214 may be non-movably fixed to the sidewall 122.

With the frame 214 being non-movably fixed relative to the sidewall 122, the compliant portion 216 is resiliently flexible or movable relative to the sidewall 122. The compliant portion 216 includes multiple connector engagement features 212, where a connector engagement feature is configured to receive and retain a respective one of multiple electrical connectors 316 (as shown in FIGS. 3-4). A connector engagement feature 212 is resiliently flexibly movable relative to the frame 214 and the sidewalls 122 via one or more suspension arms 218. In one implementation, a suspension arm 218 has a generally circuitous shape that at least partially encircles the connector engagement feature 212 to which it is coupled. A suspension arm 218 effectively suspends the connector engagement features 212 relative to the frame 214 and is resiliently flexible, with multiple flex points in some implementations, relative to the frame 214 to allow the connector engagement features 212 to move relative to the frame 214 and the sidewalls 122.

The compliant portion 216 further includes tabs 211 located on each side of respective connector engagement features 212. In the illustrated embodiment, the tabs 211 are side protrusions that extend laterally away from a respective connector engagement feature 212. Although in FIG. 2 the compliant portion 216 includes two tabs 211 for each connector engagement feature 212, in some embodiments, the compliant portion 216 can include one or more than two tabs for each connector engagement feature 212.

Although not shown, the printed circuit board 210 includes electrical circuits formed on or in the printed circuit board 210. The electrical circuits of the printed circuit board 210 facilitate the transmission of electrical power or signals there through. For example, although not shown, a connector engagement feature 212 includes electrical leads, or an electrical interface, electrically coupled with electrical traces extending along the suspension arm 218 and the frame 214 to an external electrical interface (also not shown) of the printed circuit board 210. The external electrical interface facilitates electrical interconnectivity between electronic devices external to the sled 110 and the printed circuit board 210.

Although the illustrated embodiments depict a cutout printed circuit board, the printed circuit board may be printed circuit boards of other types and configurations including but not limited to a flex printed circuit board. Although the illustrated embodiments depict tabs 211 on the printed circuit board 210, tabs with which the locking feature 412 engages may be located on the electrical connectors 316 and constrain the electrical connectors 316 in one or more degrees of freedom.

In the illustrated embodiments, the sled 110 further includes an electrical connector 316 coupled to a respective one of the connector engagement features 212 of the printed circuit board 210. In the illustrated embodiment, an electrical connector 316 is non-movably fixed to a connector engagement feature 212. Additionally, an electrical connector 316 is electrically coupled with electrical leads or an interface of a connector engagement feature 212 to facilitate the transmission of electrical signals or power between electronic devices external to the sled 110 and the electrical connector 316 via the circuitry in the frame 214 and suspension arm 218. In some implementations, an electrical connector 316 is electrically coupled with electrical leads or an interface of a connector engagement feature 212 to facilitate the transmission of electrical signals or power between one or more electronic devices stored in the sled 110.

An electrical connector 316 is also electrically coupleable with a respective one of the electronic devices 112 stored in the sled 110. Accordingly, an electrical connector 316 can be an electro-mechanical device for joining the electrical circuits of the electronic device 112 to the electrical circuits of the printed circuit board 210. The type and configuration of an electrical connector 316 will correspond to the type of electrical connector used by the electronic devices 112. For example, for a hard disk drive, the electrical connector 316 may be a Serial Attached SCSI (Small Computer System Interface) connector (SAS connector) as depicted in the illustrated embodiments. Although the illustrated embodiments depict the locking mechanism 410 as being directly lockable to the printed circuit board 210, the locking mechanism 410 may alternatively, or additionally, be lockable directly to the electrical connectors 316, the printed circuit board 210, or even cables that connect the electrical devices 112 to components external to the sled 110.

Referring to FIGS. 3-8, the sled 110 includes at least one locking mechanism 410 configured to act as a mechanical constraint for mechanically constraining movement of one of the connector engagement features 212 of the printed circuit board 210, and thus the electrical connectors 316 coupled to the connector engagement features 212, relative to the sidewalls 122. The locking mechanism 410 is movably (e.g., slidably, rotatably, etc.) coupled to a sidewall 122 of the sled 110. In other words, the locking mechanism 410 is fixedly attached to the sidewall 122, but can move (e.g., slide) relative to the sidewall 122. Additionally, the locking mechanism 410 is movable relative to the printed circuit board 210. The locking mechanism 410 is positioned between the printed circuit board 210 and the sidewall 122, such that the locking mechanism 410 is movable between the printed circuit board 210 and the sidewall 122. In one implementation, the locking mechanism 410 includes elongated slots 416 through which anchors 510 movably retain the locking mechanism 410 to the sidewall 122. The anchors 510 are non-movably fixed to the sidewall 122. Moreover, the anchors 510 engage elongated slots 416 to constrain movement of the locking mechanism 410 in the linear direction indicated by directional arrows 334 shown in FIGS. 3, 4, and 6, between a locked position (shown in FIG. 4) and an unlocked position (shown in FIG. 3). Although the illustrated embodiment depicts anchors 510 and elongated slots 416, in other embodiments, the locking mechanism 410 can be movably fixed to the sidewall 122 using other configurations and techniques.

A locking mechanism 410 may include at least one locking feature 412. In the illustrated embodiment of FIGS. 3-7, a locking mechanism 410 includes two, spaced-apart, locking features 412 on opposing sides of the locking mechanism 410. In the illustrated embodiments of FIGS. 8A and 8B, the locking mechanism 410 includes multiple locking features 412, one locking feature 412 corresponding to an electrical device 112 in the array. Generally, when a locking mechanism 410 is in the locked position, the locking features 412 releasably engage a respective one of the compliant portions 216 of the printed circuit board 210 to constrain or restrict movement, in one or more degrees of freedom, of the compliant portion 216 relative to the frame 214 of the printed circuit board 210 and thus relative to the sidewalls 122 of the sled 110. In the illustrated embodiments, the locking features 412 of a given locking mechanism 410 releasably engage respective tabs 211 of a respective one of the compliant portions 216 of the printed circuit board 210 to constrain or restrict movement of the compliant portion 216. More specifically, a locking feature 412 can be configured as a hook that releasably receives a tab 211 in the hook to constrain movement of the tab 210. In the illustrated embodiments, the locking features 412 effectively wrap around three sides of tabs 210 to constrain or restrict movement of the tabs 211 in at least three directions.

Figure 8A:
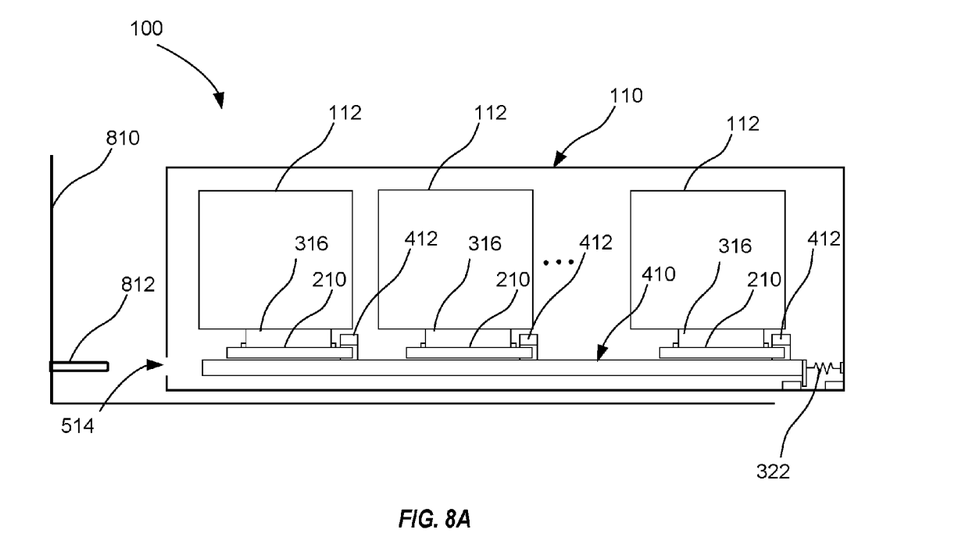
FIG. 8A is a schematic top view of an electronic device array sled, electronic devices, and a rack, according to one or more embodiments of the present disclosure.
Figure 8B:
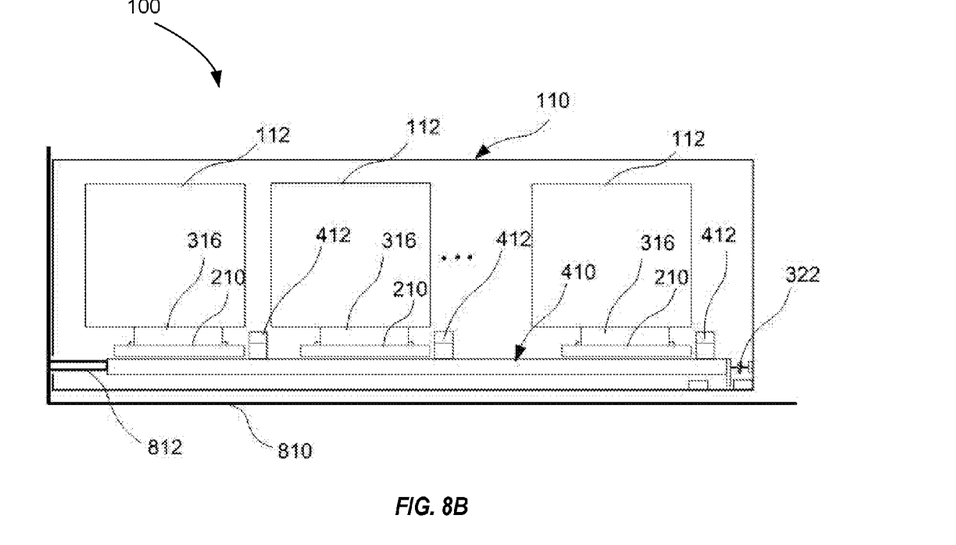
FIG. 8B is a schematic top view of the electronic device array sled, electronic devices, and rack of FIG. 8A with the sled inserted into the rack, according to one or more embodiments of the present disclosure.

Although the locking features 412 are depicted as hooks, the locking features 412 can have other configurations, or use other techniques, to releasably constrain movement of the compliant portions 216 of the printed circuit board 210 and thus the electrical connectors 316. For example, in other embodiments, a locking feature 412 may entirely surround the tabs 211 to constrain movement of the tabs 211 in all directions. For example, a locking feature 412 may be a circumferentially enclosed hole or slot which receives a respective one of the tabs 211 when the locking mechanism 410 moves into a locked position to constrain movement in at least four directions. In other embodiments, a locking feature 412 may be a clamping apparatus which clamps the electrical connector. In yet other embodiments, a locking feature 412 may be a lever which moves into place to restrict the electrical connector in one or more degrees of freedom. Although the locking mechanism 410 is shown with two locking features 412, other embodiments may include only one locking feature 412 or more than two locking features 412 (as shown in FIGS. 8A and 8B). Although the illustrated embodiments depict the locking mechanisms 410 sliding relative to the wall 122, the locking mechanisms 410 may mechanically engage the electrical connector 316, printed circuit board 210, or cables in another manner such as by rotating or pivoting into a locked position.

When a locking mechanism 410 is in the unlocked position, the locking features 412 are not engaged with (e.g., are moved away from) the printed circuit board 210 and thus do not constrain or restrict movement of the compliant portions 216 of the printed circuit board 210 and thus the electrical connectors 316. For example, movement of the locking mechanism 410 from the locked position to the unlocked position releases the tabs 211 from engagement with the locking features 412.

According to some implementations, a locking mechanism 410 includes a push tab 118. The push tab 118 is configured to be engageable with cover 114 when the cover 114 is in the closed positions (see, e.g., FIGS. 5 and 6). In one implementation, as shown in FIG. 1B, the push tab 118 of the locking mechanism 410 extends through an opening in the sidewall 122 and is positioned within cover reception space 132 of sidewall 122. In the illustrated embodiments, the push tab 118 extends through the opening in the sidewall 122 when the cover 114 is in the open position (see, e.g., the push tab 118 of the lower locking mechanism 410 of FIG. 6).

Referring to FIGS. 3-7, when the cover 114 is moved into the closed position, the cover 114 engages the push tabs 118 (see, e.g., FIGS. 5 and 6) and moves the push tabs 118 and the associated locking mechanisms 410 into the unlocked position. In other words, the cover 114 displaces the push tabs 118 from the cover reception space 132, which concurrently moves the locking mechanisms 410 into the unlocked position to disengage the locking features 412 from the tabs 211. Although the illustrated embodiments depict a push tab 118, the locking mechanisms 410 can be moved into the unlocked position by the cover 114 using other configurations and techniques. Additionally, although the illustrated embodiments depict a single locking mechanism 410 corresponding to a single connector engagement feature 212, one locking mechanism 410 may correspond to more than one connector engagement feature 212 or more than one electrical connector 316 and electronic device 112. For example, a larger locking mechanism 410 with multiple locking features 412 may, in some implementations, simultaneously lock the entire first array of electronic devices 112 (shown in FIGS. 1A and 1B) when the cover 114 is removed.

Figure 5:
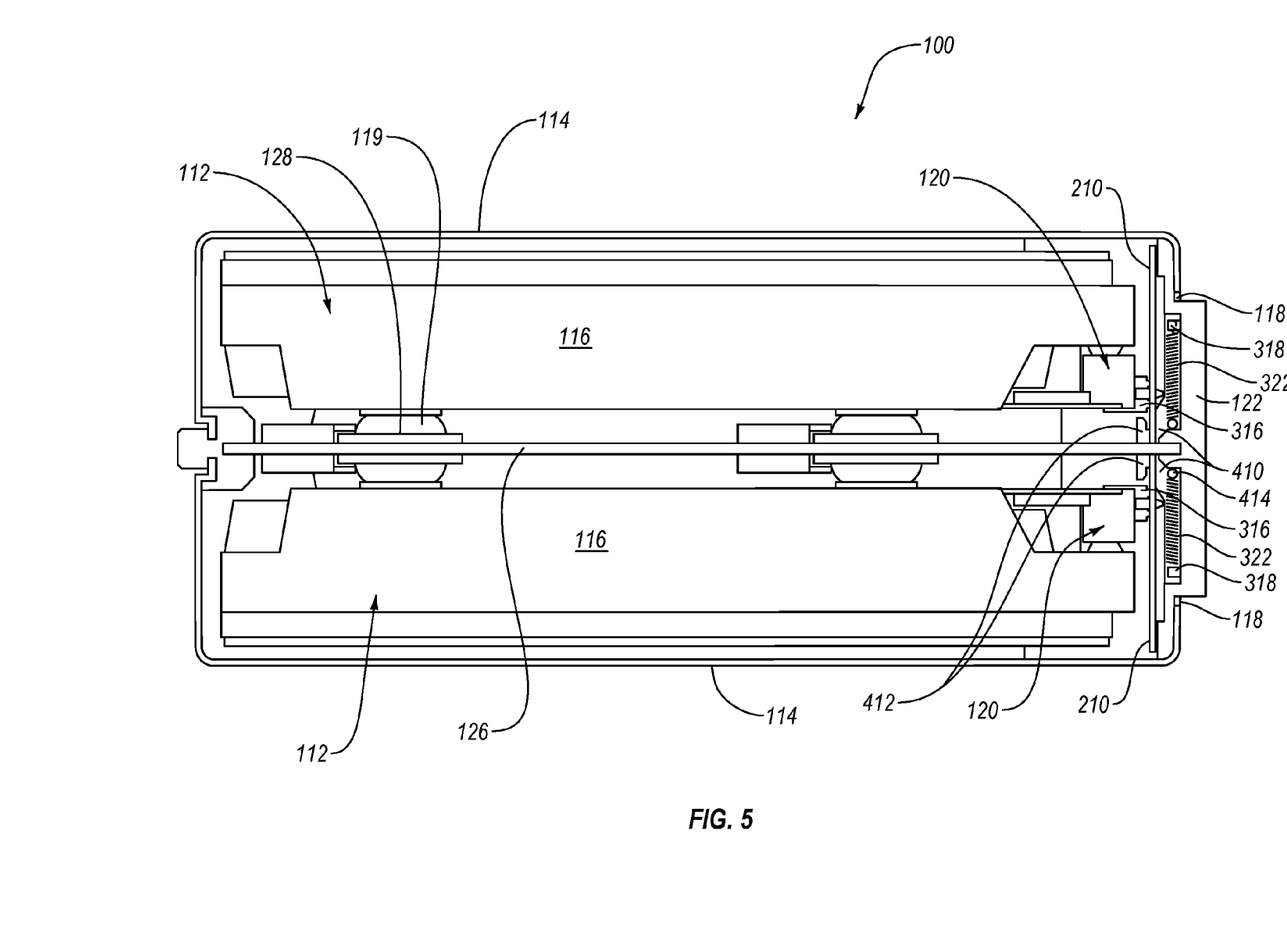
FIG. 5 is a cross-sectional side view of an electronic device array sled, according to one or more embodiments of the present disclosure.
Figure 6:
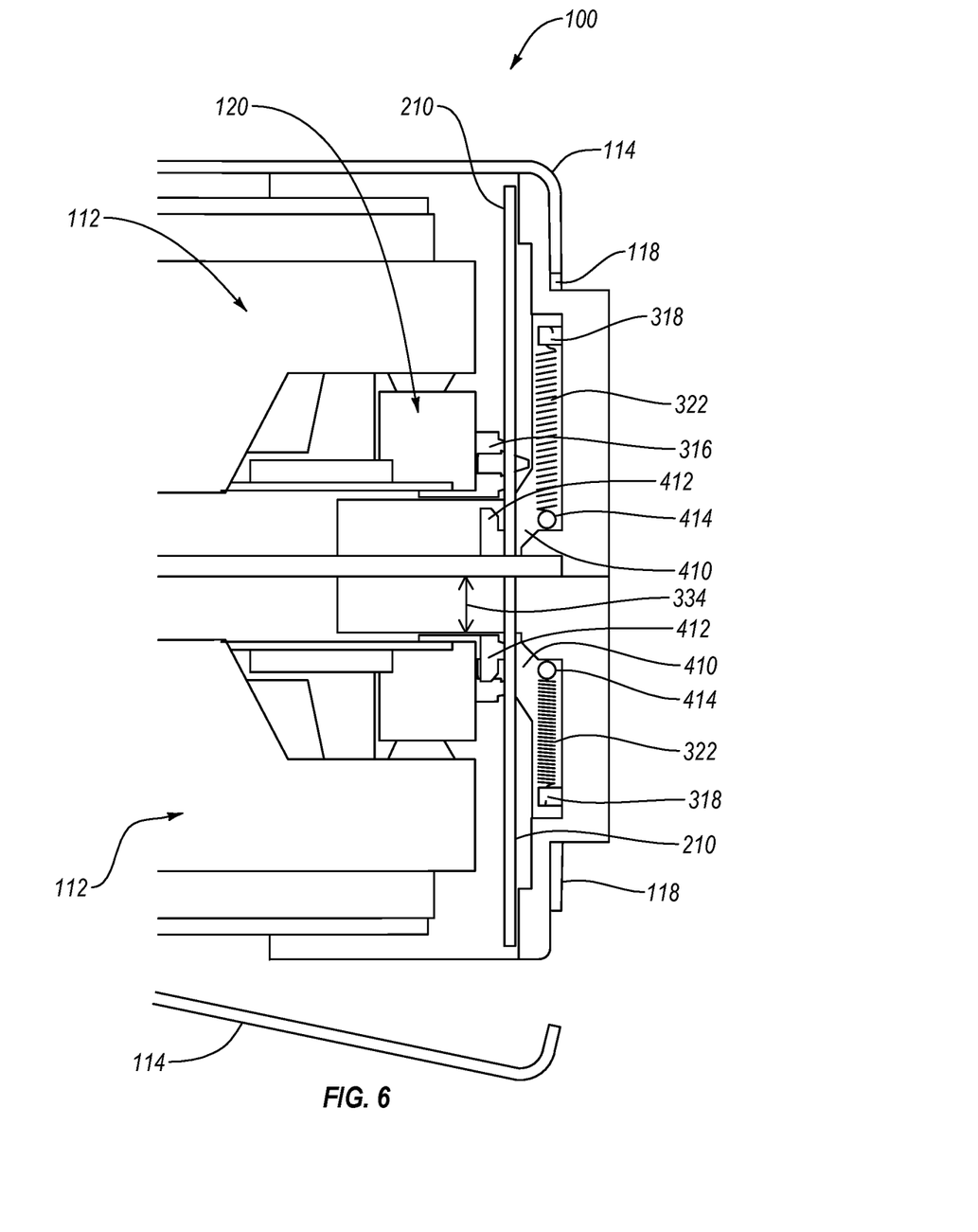
FIG. 6 is a detailed cross-sectional side view of a portion of the electronic device array sled of FIG. 5 with a top cover closed and a bottom cover open, according to one or more embodiments of the present disclosure.
Figure 7:
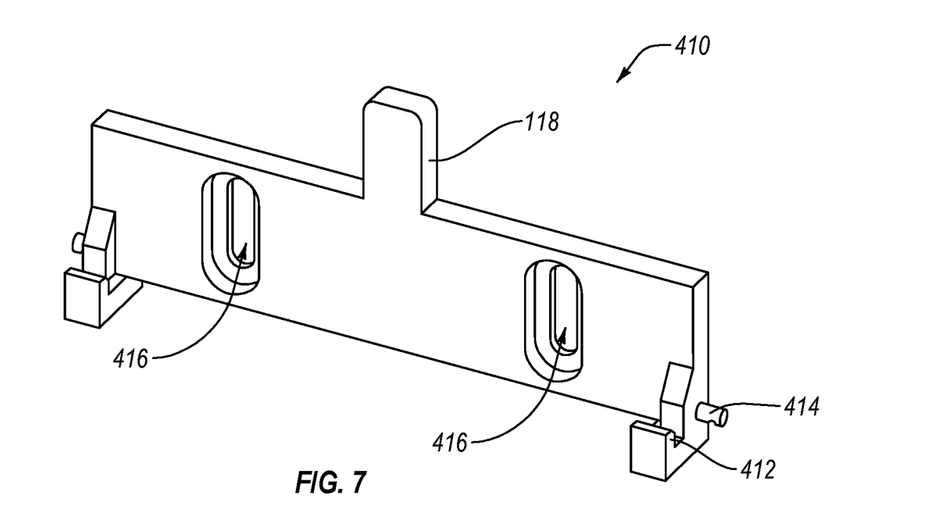
FIG. 7 is a perspective view of a locking mechanism of an electronic device array sled, according to one or more embodiments of the present disclosure.

According to some embodiments, the locking mechanisms 410 are restricted to allow movement in a single direction. The locking mechanisms 410 are configured to move in a direction orthogonal to the central mounting plate 126 back and forth between a locked position when the cover 114 is open and an unlocked position when the cover 114 is closed. When the cover 114 is closed, the cover 114 interfaces with locking mechanism 410 at a mechanical coupling surface. The cover 114 displaces the push tab 118 and moves the locking mechanism 410 to an unlocked position. Referring to FIG. 6, the lower cover 114 has been removed, and the lower locking mechanism 410 moves downwards to a locked position as the biasing element of spring 322 mechanically biases the locking mechanism 410 downwards. Referring to FIG. 6, an enhanced cut-away view of a sled 110 similar to FIG. 5 is shown with the bottom cover 114 removed and the lower locking mechanism 410 moved to a locked position.

According to some implementations, the sled 110 includes at least one biasing element configured to bias the locking mechanisms 410 into the locked position. Referring to FIG. 3, in one embodiment, a biasing element can be a spring 322. A first end of the spring 322 can be coupled to the locking mechanism 410, such as at a spring attachment point 414 of the locking mechanism 410, and a second end of the spring 322 can be coupled to the sidewall, such as at an attachment point 318 of the sidewall 122. When the cover 114 is in the closed position, engagement between the cover 114 and the tabs 118 of the locking mechanisms 410 pulls the springs 322 into tension (see, e.g., FIG. 4), which moves the locking mechanisms 410 into the unlocked position. Once the cover 114 is moved into the open position, the cover no longer prevents movement of the locking mechanism 410 into the locked position, and the induced bias of the springs 322 urges the locking mechanisms 410 into the locked position.

Although depicted as tensionable coil springs, the biasing elements may utilize other configurations and techniques to mechanically bias the locking mechanisms 410 to either the locked position or the unlocked position. In some embodiments, the biasing elements may be magnets. For example, the magnets may be placed above or below the locking mechanisms 410 and configured to respectively attract or repel the locking mechanisms 410 into the locked position. Other embodiments may utilize other mechanical and or magnetic features to bias the locking mechanisms 410 into the locked position without departing from the essence of the present disclosure.

Although the illustrated embodiments depict the locking mechanism 410 moving in response to the opening and closing of the cover 114, in some embodiments the locking mechanism 410 is activated by a manual release or other mechanism or by using other configurations and techniques. For example, referring to FIGS. 8A and 8B, in one embodiment, the locking mechanism 410 is activated via engagement with a pin 812 external to the sled 110. More specifically, the sled 110 shown in FIGS. 8A and 8B is insertable into and removable from an enclosure 810 (such as a server rack, server box, or other type of receptacle or repository) that includes a pin 812 or analogous engagement element. Referring to FIG. 8A, with the sled 110 not fully inserted into the rack 810, the locking mechanism 410 is mechanically biased by a biasing element (e.g., the spring 322) into a locked position. As opposed to multiple locking mechanisms 410 each associated with one of multiple printed circuit boards or multiple compliant portions of a single circuit board, the locking mechanism 410 is a single locking mechanism with multiple locking features 412 each configured to engage a respective one of multiple printed circuit boards 210 or multiple compliant portions of a printed circuit board. In the locked position, each locking feature 412 engages and constrains movement of a respective one of the printed circuit boards 210 and thus a respective one of the connected electrical connectors 316.

Referring to FIG. 8B, with the sled 110 fully inserted into the enclosure 810, the pin 812 engages the locking mechanism 410 to overcome the bias of the spring 322 (e.g., compress the spring 322) and move the locking mechanism 410 into an unlocked position. In the unlocked position, the locking features 412 no longer engage the printed circuit boards 210. The spring 322 remains compressed, and the locking mechanism 410 stays in the unlocked position until the sled 110 is removed from the rack 810, which disengages the pin 812 from the locking mechanism 410 and allows the bias of the spring 322 to move the locking mechanism 410 back into the locked position. In the illustrated embodiment, the pin 812 engages the locking mechanism 410 through an opening 514 in the sled 110. In some embodiments, the locking mechanism may include a portion that extends outside of the base 124 of the sled 110 allowing the pin 812 or another engagement element of the enclosure 810 to engage the locking mechanism at a point outside the sled 110. The enclosure 810 may be a server rack itself or another enclosure that may be placed within a server rack.

Figure 9:
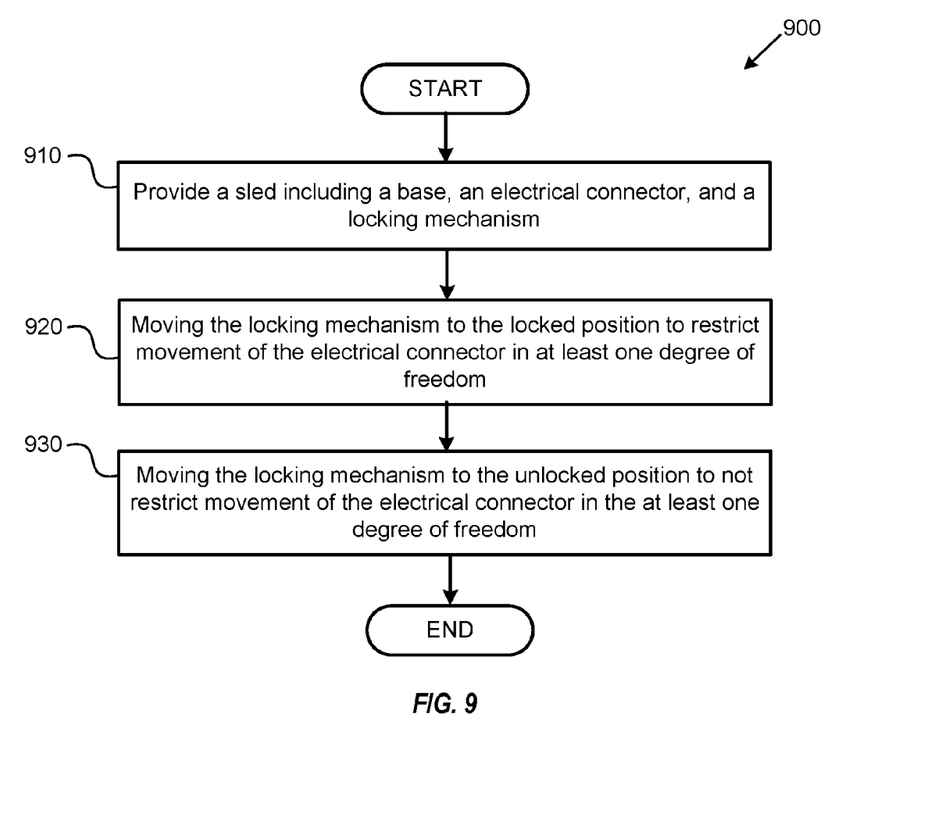
FIG. 9 is a schematic flow diagram of a method of constraining movement of an electrical connector in an electronic device array sled, according to one or more embodiments of the present disclosure.

Referring to FIG. 9, a method 900 of constraining an electrical connector in one or more degrees of freedom is shown. The method 900 includes providing a sled including a base, an electrical connector, and a locking mechanism, at 910. The locking mechanism moves relative to the base between a locked position and an unlocked position. Additionally, the method 900 includes moving the locking mechanism to the locked position to restrict movement of the electrical connector relative to the base in at least one degree of freedom at 920. The method 900 further includes moving the locking mechanism to the unlocked position to not restrict movement of the electrical connector in the at least one degree of freedom in the locked position at 930. In some embodiments, the method 900 includes moving the locking mechanism to the unlocked position in response to closing a cover. In some embodiments, the method includes moving the locking mechanism to the unlocked position in response to inserting the sled into a rack. Other embodiments of the method include the steps and processes described herein in conjunction with FIGS. 1-8B.

In the above description, certain terms may be used such as "up," "down," "upwards," "downwards," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two."

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The schematic flow chart diagrams and method schematic diagrams described above are generally set forth as logical flow chart diagrams. As such, the depicted order and labeled steps are indicative of representative embodiments. Other steps, orderings and methods may be conceived that are equivalent in function, logic, or effect to one or more steps, or portions thereof, of the methods illustrated in the schematic diagrams.

Additionally, the format and symbols employed are provided to explain the logical steps of the schematic diagrams and are understood not to limit the scope of the methods illustrated by the diagrams. Although various arrow types and line types may be employed in the schematic diagrams, they are understood not to limit the scope of the corresponding methods. Indeed, some arrows or other connectors may be used to indicate only the logical flow of a method. For instance, an arrow may indicate a waiting or monitoring period of unspecified duration between enumerated steps of a depicted method. Additionally, the order in which a particular method occurs may or may not strictly adhere to the order of the corresponding steps shown.

The present subject matter may be embodied in other specific forms without departing from its spirit or essential characteristics. The described embodiments are to be considered in all respects only as illustrative and not restrictive. All changes which come within the meaning and range of equivalency of the claims are to be embraced within their scope.

What is claimed is:

1. A system, comprising:
    a sled comprising:
        a base,
        an electrical connector positioned within and movable relative to the base; and
        a locking mechanism positioned within the base and movable, relative to the base and the electrical connector, between a locked position and an unlocked position, wherein in the locked position the locking mechanism restricts movement of the electrical connector in at least one degree of freedom relative to the base, and in the unlocked position the locking mechanism does not restrict movement of the electrical connector in the at least one degree of freedom relative to the base; and
    a data storage device positioned within the base and co-movably coupled to the electrical connector.

2. The system according to claim 1, further comprising a cover configured to open and close, wherein the locking mechanism moves relative to the base between the locked position when the cover is open and the unlocked position when the cover is closed.

3. The system according to claim 1, wherein the electrical connector comprises one of a printed circuit board, a flex printed circuit board, or a cable.

4. The system according to claim 1, wherein the sled further comprises a biasing element configured to bias the locking mechanism into the locked position.

5. The system according to claim 4, wherein the biasing element comprises a spring coupled to the locking mechanism at a first end of the spring and coupled to the base at a second end of the spring.

6. The system according to claim 1, wherein:
    the locking mechanism comprises a locking feature; and
    the locking feature restricts movement of a tab of the electrical connector in at least one degree of freedom when the locking mechanism is in the locked position and wherein the locking feature does not restrict movement of the tab of the electrical connector in the at least one degree of freedom when the locking mechanism is in the unlocked position.

7. The system according to claim 1, further comprising an enclosure, configured to store the sled and comprising an engagement element, wherein as the sled is positioned in the enclosure, the engagement element of the enclosure extends through the base and engages the locking mechanism to move the locking mechanism into the unlocked position.

8. The system according to claim 1, wherein:
    the sled further comprises an anchor configured to moveably retain the locking mechanism to the base; and
    the locking mechanism further comprises an elongated slot and wherein the anchor and elongated slot are configured to restrict movement of the locking mechanism to a single direction.

9. The system according to claim 1, wherein the electrical connector is fixed to a printed circuit board.

10. The system according to claim 1, wherein the electrical connector comprises a printed circuit board, and wherein the printed circuit board is resiliently flexible to allow movement of the printed circuit board relative to the base.

11. The system according to claim 1, wherein:
    the electrical connector comprises a printed circuit board comprising a plurality of connector engagement features;
    a connector engagement feature of the plurality of connector engagement features comprises a tab;
    the sled further comprises a plurality of locking mechanisms; and
    a locking mechanism of the plurality of locking mechanisms is configured to engage the tab of the connector engagement feature of the plurality of connector engagement features.

12. A sled comprising:
    a base;
    an electrical connector positioned within and movable relative to the base; and
    a locking mechanism positioned within the base and movable, relative to the base and the electrical connector, between a locked position and a unlocked position, wherein in the locked position the locking mechanism restricts movement of the electrical connector in at least one degree of freedom relative to the base, and in the unlocked position the locking mechanism does not restrict movement of the electrical connector in the at least one degree of freedom relative to the base.

13. The sled according to claim 12, further comprising a cover configured to open and close, wherein the locking mechanism moves relative to the base between the locked position when the cover is open and the unlocked position when the cover is closed.

14. The sled according to claim 12, wherein the electrical connector comprises a printed circuit board, and wherein the printed circuit board is resiliently flexible to allow movement of the printed circuit board relative to the base.

15. The sled according to claim 12, further comprising a biasing element configured to bias the locking mechanism into the locked position.

16. The sled according to claim 15, wherein the biasing element comprises a spring coupled to the locking mechanism at a first end of the spring and coupled to the base at a second end of the spring.

17. The sled according to claim 12, wherein the electrical connector is fixed to a printed circuit board.

18. The sled according to claim 12, further comprising a cover configured to open and close, wherein the locking mechanism comprises a push tab, and wherein the sled further comprises a mechanical coupling between the cover and the push tab, the mechanical coupling configured to move the locking mechanism to the unlocked position when the cover is closed.

19. The sled according to claim 12, wherein the locking mechanism comprises a hook, wherein the hook restricts movement of a tab of the electrical connector in at least one degree of freedom when the locking mechanism is in the locked position and wherein the hook does not restrict movement of the tab of the electrical connector in the at least one degree of freedom when the locking mechanism is in the unlocked position.

20. A method of constraining an electrical connector in at least one degree of freedom, the method comprising:
  providing a sled comprising:
    a base;
    an electrical connector positioned within and movable relative to the base; and
    a locking mechanism positioned within the base and movable,
  relative to the base and the electrical connector, between a locked position and an unlocked position;
  moving the locking mechanism to the locked position to restrict movement of the electrical connector in at least one degree of freedom relative to the base; and
  moving the locking mechanism to the unlocked position to not restrict movement of the electrical connector in the at least one degree of freedom relative to the base.

* * * * *